(12) United States Patent
Klink et al.

(10) Patent No.: US 8,198,135 B2
(45) Date of Patent: Jun. 12, 2012

(54) METHOD FOR PRODUCING FLEXIBLE INTEGRATED CIRCUITS WHICH MAY BE PROVIDED CONTIGUOUSLY

(75) Inventors: Gerhard Klink, Fuerstenfeldbruck (DE); Christof Landesberger, Graefelfing (DE); Michael Feil, Munich (DE)

(73) Assignee: Fraunhofer-Gesellschaft zur Foerderung der Angewandten Forschung e.V., Munich (DE)

( * ) Notice: Subject to any disclaimer, the term of this patent is extended or adjusted under 35 U.S.C. 154(b) by 0 days.

(21) Appl. No.: 12/943,061

(22) Filed: Nov. 10, 2010

(65) Prior Publication Data
US 2011/0047793 A1 Mar. 3, 2011

Related U.S. Application Data

(62) Division of application No. 11/850,531, filed on Sep. 5, 2007, now abandoned.

(30) Foreign Application Priority Data

Sep. 21, 2006 (DE) .......................... 10 2006 044 525

(51) Int. Cl.
*H01L 21/00* (2006.01)
*H05K 1/16* (2006.01)

(52) U.S. Cl. ........ 438/108; 257/676; 257/679; 257/778; 257/780; 174/260

(58) Field of Classification Search ........................ None
See application file for complete search history.

(56) References Cited

U.S. PATENT DOCUMENTS

| | | | |
|---|---|---|---|
| 2005/0040242 A1* | 2/2005 | Beenau et al. | 235/492 |
| 2005/0093172 A1* | 5/2005 | Tsukahara et al. | 257/778 |
| 2006/0030070 A1* | 2/2006 | Leu et al. | 438/106 |
| 2007/0057796 A1* | 3/2007 | Craig et al. | 340/572.7 |

OTHER PUBLICATIONS

Klink et al.; "Method for Producing Flexible Integrated Ciruits Which may be Provided Contiguously"; U.S. Appl. No. 11/850,531, filed Sep. 5, 2007.

* cited by examiner

*Primary Examiner* — Ha Tran T Nguyen
*Assistant Examiner* — Aaron Dehne
(74) *Attorney, Agent, or Firm* — Keating & Bennett, LLP

(57) ABSTRACT

The present invention provides a method for producing integrated circuits which are mechanically flexible and can be provided contiguously on a common flexible carrier substrate. The method includes a step of continuously providing a first flexible substrate which has conductor-line patterns, and a step of mounting the integrated circuits on the first flexible substrate and connecting the integrated circuits to the conductor-line patterns of the first flexible substrate, and a step of covering the circuits mounted on the first flexible substrate with a second flexible substrate, recesses being provided in the first or second flexible substrates in order to make the conductor-line patterns of the first flexible substrate accessible. The step of covering has the sub-step of continuously providing a flexible film with recesses and laminating same onto the flexible integrated circuits mounted on the first flexible substrate, or a sub-step of applying, by a printing technique, a cover on the flexible integrated circuits mounted on the first flexible substrate.

7 Claims, 7 Drawing Sheets

METHOD FOR PRODUCING FLEXIBLE INTEGRATED CIRCUITS WHICH MAY BE PROVIDED CONTIGUOUSLY

CROSS-REFERENCE TO RELATED APPLICATIONS

This application claims priority from German Patent Application No. 10 2006 044 525.2, which was filed on Sep. 21, 2006, and is incorporated herein in its entirety by reference.

BACKGROUND OF THE INVENTION

1. Field of the Invention

The present invention refers to a method for producing integrated circuits which are mechanically flexible and may be provided contiguously on a common flexible carrier substrate, as well as to their further processing.

2. Description of the Related Art

Integrated circuits are increasingly processed as increasingly thinner chips. The reason for this is the demand for assemblies which are as flat as possible, e.g. in portable devices, in order to provide the highest possible functionality in a small volume. The underlying technology for the production of these thin ICs (IC=integrated circuit) is the thinning technique for semiconductor wafers, by which the thickness of ICs can now be reduced as a standard to thicknesses less than 100 μm. The possibility of producing ICs with a residual thickness within the range of 10-20 μm which, in this range, are becoming increasingly flexible mechanically has also been demonstrated by now.

This mechanical flexibility is advantageous in particular for producing flat or flexible electronic systems and their processing on film substrates. A well-known example is the production of the so-called smart labels, wherein a substrate provided with antenna structures is equipped with integrated circuits for RF identification (RF=radio frequency). The IC is directly connected, without packaging, mechanically to the substrate and electrically to the antenna.

For more complex assemblies, very thin ICs have not yet become generally accepted. The main reason for this is that manufacturers are not in a position, in terms of technology, to process non-packaged components, since this entails very strict requirements in terms of accuracy of placement, structural accuracy of the carrier and the interconnection technology. In the case of extremely thin flexible ICs, there is also the fact that the technique for handling these components becomes substantially more complicated. Usually the manufacturers who process electronic circuits further therefore may advantageously use packaged ICs, which may be processed with a uniform assembly method and larger structural dimensions. Common forms of packaging, however, are not able to achieve the two substantial advantages of ultra-thin chips, namely an extremely flat design and mechanical flexibility.

Packaged devices are provided for further processing in different forms of packaging. To this end, packaged devices are loaded into trays, rails, belts or the like and supplied in this form to fitting machines for assembly. A drawback of the known manufacturing methods for flexible integrated circuits is that a direct and effective further processing cannot be achieved, since the known forms of packaging do not permit a continuous presentation due to lack of mechanical stability.

EP 1028436 describes, for example, thin integrated circuits which are manufactured in a flexible package comprised of a substrate film, wiring, thin IC and encapsulation. The method provided there has the drawback that continuous manufacturing and further processing of the flexible components is not possible, since the flexible film packages used there do not have a continuous coating.

EP 1256983 essentially describes, for example, a method for producing flexible integrated circuits by a transfer method from a semiconductor wafer to a polymer layer. The drawback of the method introduced is that no solutions for the structure, bonding, or contacting, and connection technique for integration into systems can be indicated.

DE 19542883 introduces, e.g., a flexible chip package which uses films. The chip itself is inserted into the film package by means of lamination, but is itself thick and rigid, i.e. the resulting package is, again, not flexible.

DE 19845296 describes, e.g., a method for bonding a circuit chip. Isoplanar bonding techniques are used, by means of which particularly flat designs are possible. The bonding is achieved by means of a silk-screen printing or stamp-printing method, these methods being used to apply a metallization to the thin circuit fitted onto a carrier, in order to connect the pads of the circuit chip to a conductive pattern arranged on the main surface of the carrier substrate. The bonding of thin circuits during the production of flat assemblies is described.

In Christians, W. et. Al.: "Embedded ultra-thin chips in Flex, 4th int. Workshop on Flexible Electronic Systems, Nov. 23, 2005, IZM Munich, the authors describe a method for packaging ultra-thin chips. In the case of the chips presented, a total thickness of about 50-60 μm is assumed, the thickness of the ICs ranging between 20 and 30 μm. The process cycle shall be described more in detail with reference to FIG. 7. FIG. 7 shows process steps 71 to 76, which illustrate the manufacturing method. In a first step 71, a first polyimide layer 71b is initially spun on a fixed carrier 71a, which may be made of glass, for example, and is cured. In a second step 72, BCB (BCB=benzocyclobotene) 72a is applied, by means of a dispenser, as an adhesive for fixing a thin chip.

Then, in a following step 73, a thin chip 73a is placed in the humid adhesive bed and the BCB 72a is cured. Then, in a step 74 a second polyimide layer 74a is spun. By means of a laser, openings 75a can then, in a step 75, be bored to the contact pads of the chip 73a. The bonding, expansion of the connections and the creation of the external contacts then occur in a metallization and patterning process, in a step 76, which illustrates the mounting of the contact surfaces 76a.

Thereupon, the finished film package is then separated from the rigid carrier, and a flexible chip package is thus obtained. A drawback of the described method is that due to the use of the rigid carrier, a manufacturing process with a continuous provision of the carrier is not possible. Another drawback of this technique is the high requirements placed upon the manufacturing of the openings and the contacts, which result from the fact that an expansion of the contact structures does not occur until after manufacturing of the chip contacts. Another drawback resides in the open expansion of the contact structures. In order to avoid short-circuits with the substrate wiring, either an insulating intermediate sheet must be used, or a structural concept is applied wherein only the contacts on the film package are open.

SUMMARY OF THE INVENTION

According to an embodiment, a method for producing integrated circuits which are mechanically flexible and can be provided contiguously on a common flexible carrier substrate may have the steps of: continuously providing a first flexible substrate having conductor-line patterns, mounting the integrated circuits on the first flexible substrate and connecting the integrated circuits to the conductor-line patterns of the first flexible substrate, and covering the circuits mounted on the first flexible substrate with a second flexible substrate, recesses being provided or generated in the first or second flexible substrates in order to make the conductor-line patterns of the first flexible substrate accessible, having the sub-steps of: continuously providing a flexible film with or without recesses and laminating same onto the flexible integrated circuits mounted on the first flexible substrate, or applying, by a printing technique, a cover to the flexible integrated circuits mounted on the first flexible substrate.

According to another embodiment, a method for producing electronic assemblies with packaged integrated circuits which are mechanically flexible and can be provided contiguously on a common carrier substrate may have the steps of: continuously providing the flexible packaged integrated circuits, the flexible packaged integrated circuits being arranged between first and second flexible substrates and connected to conductor-line patterns of the first flexible substrate, recesses being provided in the first or second flexible substrates in order to make the conductor-line patterns of the first flexible substrate accessible, and mounting one of the provided packaged integrated circuits on one of the electronic assemblies, having the sub-steps of: mechanically and electrically connecting the one packaged integrated circuit to the one electronic assembly; and separating the packaged electrical circuit from the packaged integrated circuits supplied contiguously.

According to another embodiment, a method for producing packaged integrated circuits which are mechanically flexible and can be provided contiguously on a common flexible carrier substrate may have the steps of: continuously providing a first flexible substrate having conductor-line patterns, mounting the flexible integrated circuits on the first flexible substrate and connecting the integrated circuits to the conductor-line patterns of the first flexible substrate, and covering the circuits mounted on the first flexible substrate with a second flexible substrate, recesses being generated in the first flexible substrate or being provided or generated in the second flexible substrate in order to make the conductor-line patterns of the first flexible substrate accessible, having the sub-steps of: continuously providing a flexible film as the second flexible substrate with or without recesses and laminating same onto the flexible integrated circuits mounted on the first flexible substrate, or applying, by a printing technique, a cover as the second flexible substrate to the flexible integrated circuits mounted on the first flexible substrate.

According to another embodiment, a method for producing packaged integrated circuits which are mechanically flexible and can be provided contiguously on a common flexible carrier substrate may have the steps of: continuously providing a first flexible substrate having conductor-line patterns, mounting the flexible integrated circuits on the first flexible substrate and connecting the integrated circuits to the conductor-line patterns of the first flexible substrate, and covering the circuits mounted on the first flexible substrate with a second flexible substrate, recesses being provided or generated in the second flexible substrate in order to make the conductor-line patterns of the first flexible substrate accessible, having the sub-steps of: continuously providing a flexible film as the second flexible substrate with or without recesses and laminating same onto the flexible integrated circuits mounted on the first flexible substrate, or applying, by a printing technique, a cover as the second flexible substrate to the flexible integrated circuits mounted on the first flexible substrate.

The present invention creates a method for producing integrated circuits which are mechanically flexible and can be provided together on a common flexible carrier substrate, comprising a step of continuously providing a first flexible substrate, which has conductor-line patterns, and a step of mounting the integrated circuits on the first flexible substrate and connecting the integrated circuits to the conductor-line patterns of the first flexible substrate. The method for producing integrated circuits includes, furthermore, a step of covering the circuits mounted on the first flexible substrate with a second flexible substrate, recesses in the first or second flexible substrates being provided or generated in order to make the conductor-line patterns of the first flexible substrate accessible, and having a sub-step of continuously providing a flexible film with or without recesses and laminating same on the flexible integrated circuits mounted on the first flexible substrate, or a sub-step of technically applying a cover to the flexible integrated circuits mounted on the first flexible substrate.

The present invention creates, furthermore, a method for producing electronic assemblies with packaged integrated circuits, which are mechanically flexible and may be provided contiguously on a common carrier substrate, comprising a step of continuously providing the flexible packaged integrated circuits, the flexible packaged integrated circuits being arranged between a first and a second flexible substrate and connected to conductor-line patterns of the first flexible substrate, recesses being provided in the first or second flexible substrates in order to make the conductor-line patterns of the first flexible substrate accessible. The method for producing electronic assemblies furthermore comprises a step of mounting one of the provided packaged integrated circuits to one of the electronic assemblies, comprising a sub-step of mechanically and electrically connecting the one packaged integrated circuit to the one electronic assembly, and a sub-step of separating the one packaged electrical circuit from the packaged integrated circuits supplied contiguously.

The finding of the present invention consists in the fact that thinned integrated circuits are fitted for further processing on a film provided with conductor lines as an intermediate carrier. The production may then advantageously occur on continuous substrates by a reel-to-reel method, wherein an isoplanar or flip-chip bonding can be used accordingly, which is substantially easier to control than conventional bonding techniques.

Embodiments of the present invention have the advantage that the flexible integrated circuits can be manufactured continuously, and that subsequently flexible packaged integrated circuits are at hand. These flexible packaged integrated circuits can also be provided continuously, during further processing, for example by a reel-to-reel method. The IC packaging has an extremely flat design. Thanks to the use of continuous processes, i.e. to continuous provision of the assemblies without these having to be separated first, the production becomes very economical and efficient. The packaged integrated circuits remain mechanically flexible. This results in possibilities of use in flexible electronic systems.

Embodiments of the present invention furthermore provide higher reliability as regards thermomechanical stresses. The production of the IC packaging can occur directly by a continuous reel-to-reel process. Further processing, for example component tests, markings and assembly, can furthermore occur in a reel-fed manner. Sorting into belts for automatic component insertion is omitted, since the devices manufactured according to the method of the invention can, thanks to their increased flexibility, be further stored for example in a reeled-up condition.

The assembly of flexible or flat assemblies is made easier for the user by the method according to the invention. No special tools are needed for the handling and fitting of the ultra thin ICs. For processing the flexible package, standard processes of SMD mounting (SMD=surface mounted devices) can be used. An important advantage of the present invention resides in the easy mounting of the flexible IC packages, which can be mounted to the assemblies e.g. by means of hot lamination.

BRIEF DESCRIPTION OF THE DRAWINGS

Embodiments of the present invention will be detailed subsequently referring to the appended drawings, in which.

DETAILED DESCRIPTION

Figure 1:
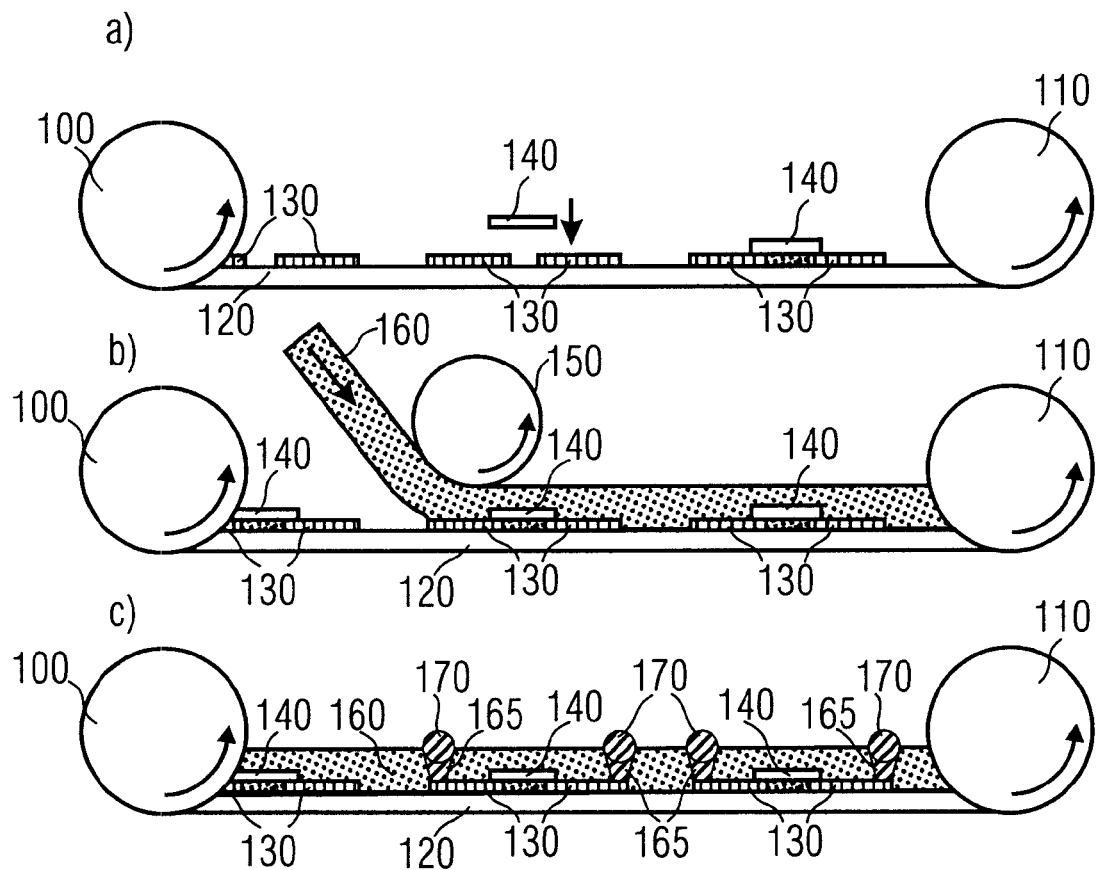
FIG. 1a-c show an embodiment of a production method according to the invention.

The following figures serve to explain embodiments according to the invention of production methods for producing integrated circuits. In the following figures, same elements will be designated by same reference numerals, so that the respective descriptions of these elements are interchangeable.

FIG. 1a shows a first reel 100, a second reel 110 and a base substrate 120 which is provided with conductor lines 130 and which has flexible integrated circuits 140 applied to it.

As the base substrate 120, both plastic films and composite films made of metal and an insulating plastic layer may be used here. The latter are advantageous in particular for components having a relatively high energy dissipation, in which improved heat evacuation or heat dissipation of the system can be achieved by means of the metallic carrier material. The film substrate, i.e. the base substrate 120, is provided, for example by methods of the thick-film or thin-film technique, with conductor lines or a wiring pattern 130, which serve in particular to expand the close connection grid of the IC and to thus simplify the subsequent mounting to an assembly. On this base substrate 120 is then mounted, according to FIG. 1a, the thin IC 140, e.g. by means of the flip-chip technique.

The flip-chip technique is a mounting method of the field of the mounting and connecting technique (AVT—Aufbau-und Verbindungstechnik) in microelectronics for bonding unpackaged semiconductors by means of bumps, or contact bumps. The chip is mounted directly and without further connecting leads with the active bonding side down toward the substrate/circuit carrier. This results in particularly small dimensions of the package and short conductor lengths. In the case of very complex circuits, this technology often provides the only useful possibility of connection, because several hundred contacts are implemented. In wire bonding, this is not possible, because the wires would intersect and would very probably come into contact with each other. Furthermore, in wire bonding, the connections are established successively. With the flip-chip technique, the connection of all contacts occurs at the same time and thus results in time saving.

Alternatively, for very thin ICs, isoplanar bonding can also be used, bondings being printed on by a silk-screen printing method, an ink-jet method or a stamp-printing method. By means of these methods, a metallization is applied to the thin circuit mounted on a carrier in order to connect the pads of the circuit chip to a conductor pattern arranged on the main surface of the carrier substrate.

According to FIG. 1a, the base substrate is unreeled from the first reel 100 and reeled up, after the process steps described below have been performed, onto a second reel 110. Thus, the embodiment of a method for producing integrated circuits also enables the subsequently packaged circuits to be mechanically flexible and to be provided together on a common flexible carrier substrate 120 for further processing, the continuity of provision being achieved, in the embodiment of the present invention considered here, by the reels 100 and 110. During the continuous provision of the first flexible substrate 120, which, according to the above description, already has conductor-line patterns 130, the mounting of the integrated circuits 140 occurs on the first flexible substrate 120. Also, at the same time, the integrated circuits 140 are connected to the conductor-line patterns 130 of the base substrate 120.

A next step of the embodiment of the method according to the invention is shown in FIG. 1b. FIG. 1b shows now in addition, with respect to FIG. 1a, a third reel 150 and a second flexible substrate 160, which will also be referred to as protection or top layer hereinafter. According to the invention, via the third reel 150 the second flexible substrate 160 is applied to the flexible integrated circuits 140 mounted on the first substrate 120. In this way, the mounted flexible integrated circuits 140 receive a protection or top layer 160. What is thus performed, according to the invention, is a process step of covering the circuits 140 placed on the first flexible substrate 120 with a second flexible substrate 160, recesses 165 being provided or generated in the first flexible substrate 120 or in the second flexible substrate 160, in order to make the conductor-line patterns 130 of the first flexible substrate 120 accessible. This can occur for example by means of a sub-step of continuously providing a flexible film, i.e. the second flexible substrate 160, with recesses 165, the flexible film being fixed by laminating same on the flexible integrated circuits 140 placed on the first flexible substrate 120. Alternatively, the application of the second flexible substrate 160 can occur by applying, using printing techniques, a top layer on the flexible integrated circuits 140 placed on the first flexible substrate 120.

The protective layer or the second flexible substrate 160 can thus be obtained by laminating a top film or by means of coating processes, openings 165 or recesses for wiring the carrier film being provided or generated. For example, the latter can be applied in a particular efficient way by printing methods, such as for example screen printing, since this provides the possibility of applying the protection layer or the second flexible substrate 160 already with the openings 165 in one processing step. The pattern definition of such printing methods is limited, so that no arbitrarily small openings or recesses 165 can be achieved. In order to obtain smaller openings 165, in other embodiments of the present invention, a full-surface top film or coating, i.e. the second flexible substrate 160, can be applied, and the openings can then be made by means of known plasma-etching or laser-patterning methods. In another embodiment of the method according to the invention, a photosensitive material could alternatively be used for the top layer, i.e. for the second flexible substrate 160 and, after the coating, be patterned directly by photolithographic methods. In these methods are used, for example, photosensitive plastics which are applied in a liquid state on the assemblies and are then cured by irradiation, for example with laser or UV-light (UV=ultra violet).

Afterwards, it is only contacts 170 for the electrical connections of the package that are implemented. This operation is represented in FIG. 1c. In an embodiment of the present invention, the contacts 170 can be implemented, for example, by means of suitable soldering bumps 170, which may be used to carry out direct mounting, by means of welding, on a subsequent assembly. Other known bonding techniques, such as for example gluing or welding, are also feasible, however.

Figure 2:
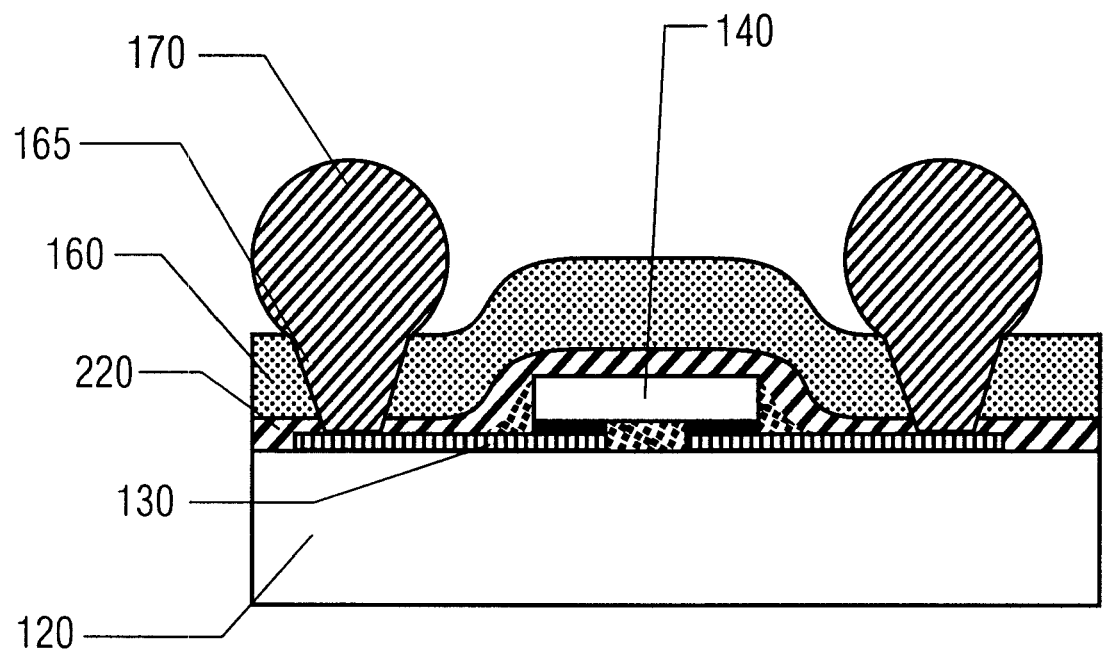
FIG. 2 shows an embodiment of a flexible circuit manufactured by the method according to the invention.

An embodiment of a flexible integrated circuit which can be produced with an embodiment of a method according to the invention is shown in FIG. 2.

FIG. 2 shows a film substrate 120 to which wiring pattern is applied in the form of conductor lines 130, as described above. On the wiring pattern 130 is then mounted the thin IC 140 according to the above description. Alternatively, in the case of an optional film lamination, an adhesive layer 220 can then be applied between the mounted thin IC 140 and the top layer 160. In the top layer 160 there are openings or recesses 165, through which a contact material 170 for bonding the wiring pattern 130 is applied. FIG. 2 shows an embodiment of the package having so-called soldering bumps 170, in which a protected chip 140 is formed in the form of a flexible film package. Alternatively, the contacts can also be established on the side of the carrier film 120 after applying the top layer 160.

Figure 3:
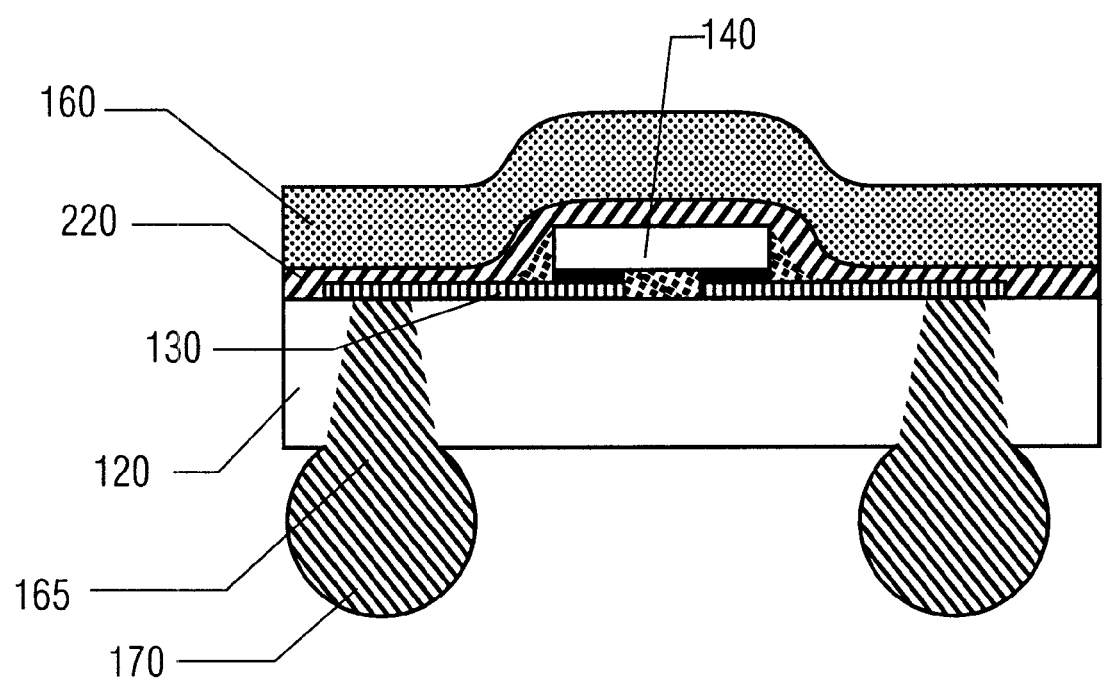
FIG. 3 shows another embodiment of a flexible integrated circuit manufactured by the method according to the invention.

This embodiment is represented in FIG. 3. FIG. 3 shows, in turn, a film substrate 120 with a wiring pattern 130. On the wiring pattern 130 a thin IC 140 is mounted on which an adhesive layer 220 is optionally present and which is then covered as a whole with a top layer 160. The embodiment represented in FIG. 3 has openings 165 in the film substrate 120, through which the wiring pattern 130 can be bonded by means of a contact material 170. The arrangement in FIG. 3 shows an embodiment of the flexible integrated circuit, which is, in this case, bonded by the carrier material, i.e. the film substrate 120. The embodiment shown in FIG. 3 allows a particularly plane package surface on the mounting side. The concept represented allows producing a chip module which has approximately plane-parallel surfaces. This is particularly advantageous, since forces exerted from the outside then will act not only on the chip, but will be evenly distributed across the module. This is also important when the packaged modules are to be reeled up onto a reel in the form of a chip-module tape, since breaks can otherwise occur in the chip. The embodiment of the present invention represented in FIG. 3 thus enables the advantage of storing a reeled-up chip-module tape.

Figure 4:
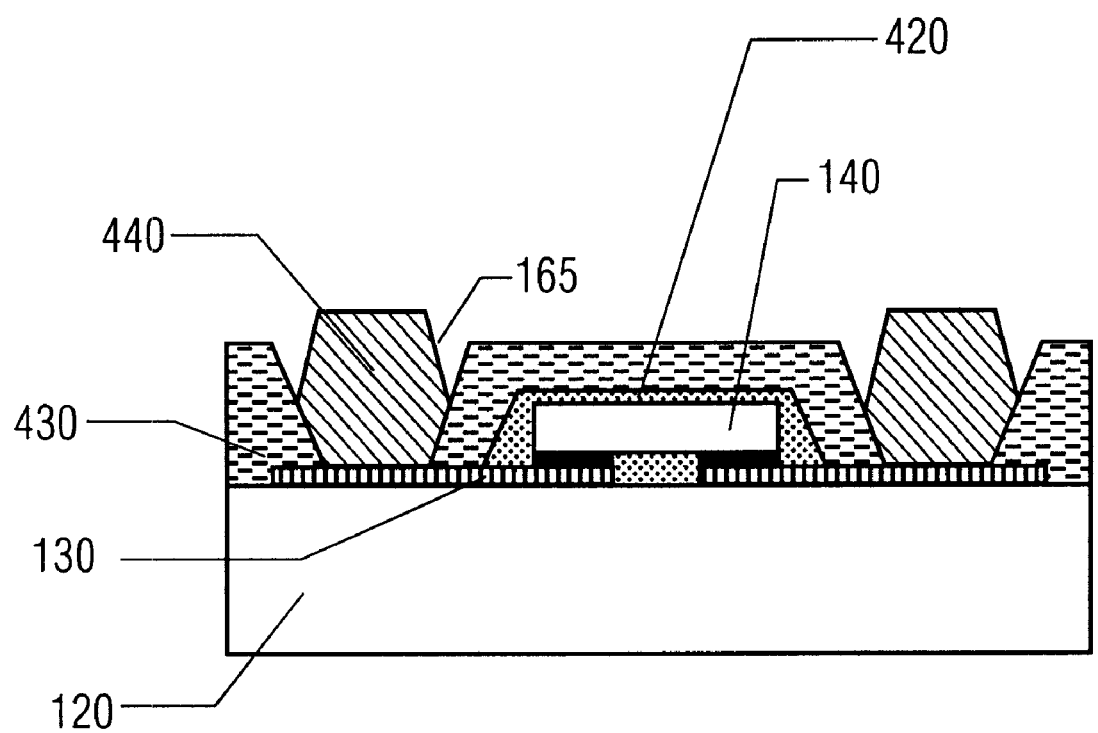
FIG. 4 shows an embodiment of a flexible integrated circuit manufactured by the method according to the invention.

Another embodiment of a flexible chip which can be produced with an embodiment of the manufacturing method according to the invention is represented in FIG. 4. FIG. 4 shows a film substrate 120 to which a wiring pattern 130 is applied. A thin IC 140 is mounted on the wiring pattern 130. The mounted thin IC 140 is, in the embodiment in FIG. 4, surrounded by a passivation layer 420, which can contribute for example to the insulation and additional protection of the IC 140. In the embodiment of FIG. 4, an insulating hot adhesive 430, which both surrounds the passivation layer 420 of the mounted thin IC 140 and insulates the wiring pattern 130 at the limits of the module, serves as a top layer. In the present embodiment, a conductive hot adhesive 440 serves as a contact material.

In the embodiment represented in FIG. 4, the film substrate 120 with the mounted thin IC 140 can be coated, on the mounting side, with a top layer of thermoplastic adhesive 430 which can be in the form of, e.g., hot-setting adhesive or hot-melt adhesive, which, again, is provided with openings or recesses 165 for creating electrical connections. An electrically conductive thermoplastic adhesive 440 is then introduced into these openings 165. In this context, it is advantageous that the same thermoplastic adhesive can be used for both applications. In the case of the conductive thermoplastic adhesive 440, electrically conductive particles, for example, such as, e.g., silver, may be introduced into the thermoplastic adhesive 440.

During the mounting of the film package on an assembly, both the insulating and the electrically conductive adhesive layers are melted, so that both the electrical and the mechanical connection to the component-group carrier can occur in one single process step. The mounting of the flexible film packaging can thus also be integrated very easily into a continuous manufacturing process, i.e. into a reel-to-reel process, in which the melting occurs in a similar way as in film-laminating processes by hot-laminating systems, wherein the hot adhesive can for example be melted via heatable metal rollers and is at the same time distributed or pressed by means of a rotary roller.

Figure 5:
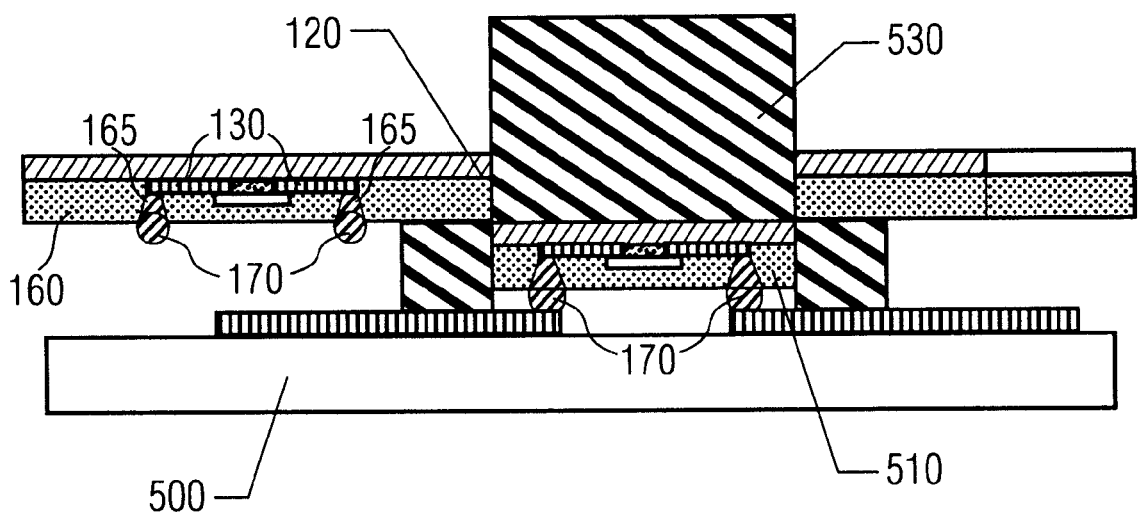
FIG. 5 shows an embodiment of a schematic flow of a further processing method according to the invention.

For mounting integrated circuits thus packaged within a film, the components can be supplied for mounting directly from the reel. FIG. 5 schematically shows such a process according to another embodiment of the present invention. FIG. 5 shows an assembly 500 on which is mounted a flexible film package 510. To this end, from the film with the ICs 520, it is in one process step that the latter are separated by means of a punching tool 530 and mounted. The method represented in FIG. 5 for producing electronic assemblies with packaged integrated circuits 510, which are mechanically flexible and may be provided contiguously on a carrier substrate 120, includes the step of continuously providing the flexible packaged integrated circuits 510, the flexible packaged integrated circuits being arranged between first 120 and second flexible substrates 160 and connected to conductor-line patterns 130 of the first flexible substrate 120, recesses or openings 165 being provided in the first 120 or second flexible substrates 160 in order to make the conductor-line patterns 130 of the first flexible substrate 120 accessible.

The process according to the invention for producing electronic assemblies includes, furthermore, a step of mounting one of the provided packaged integrated circuits 510 on an electronic assembly 500, comprising a sub-step of mechanically and electrically connecting the packaged integrated circuit 510 to the electronic assembly 500, as well as a step of separating the packaged electrical circuit 510 from the packaged integrated circuits 520 run contiguously. The separation can occur for example by means of a heated punching tool 530, wherefore the steps of separating and of mechanically and electrically coupling can be combined into one single process step. The mechanical and electrical coupling occurs by melting the soldering bumps by means of the heatable punching tool 530.

According to the FIG. 5, in the embodiment of the method according to the invention, after placing the package, the component is separated from the film through die-cutting or cutting, and is connected by means of a mounting tool, for example a punching tool 530, with the necessary application to pressure and temperature, to the assembly 500. What is advantageous here is that the die-cutting and mounting operations can be combined into one single process step. According to the different mounting methods, a plurality of configurations or embodiments may be produced for such a reel-to-reel package, for example according to the preceding embodiments, and may be subsequently processed according to the embodiment of the further processing method in FIG. 5.

Figure 6:
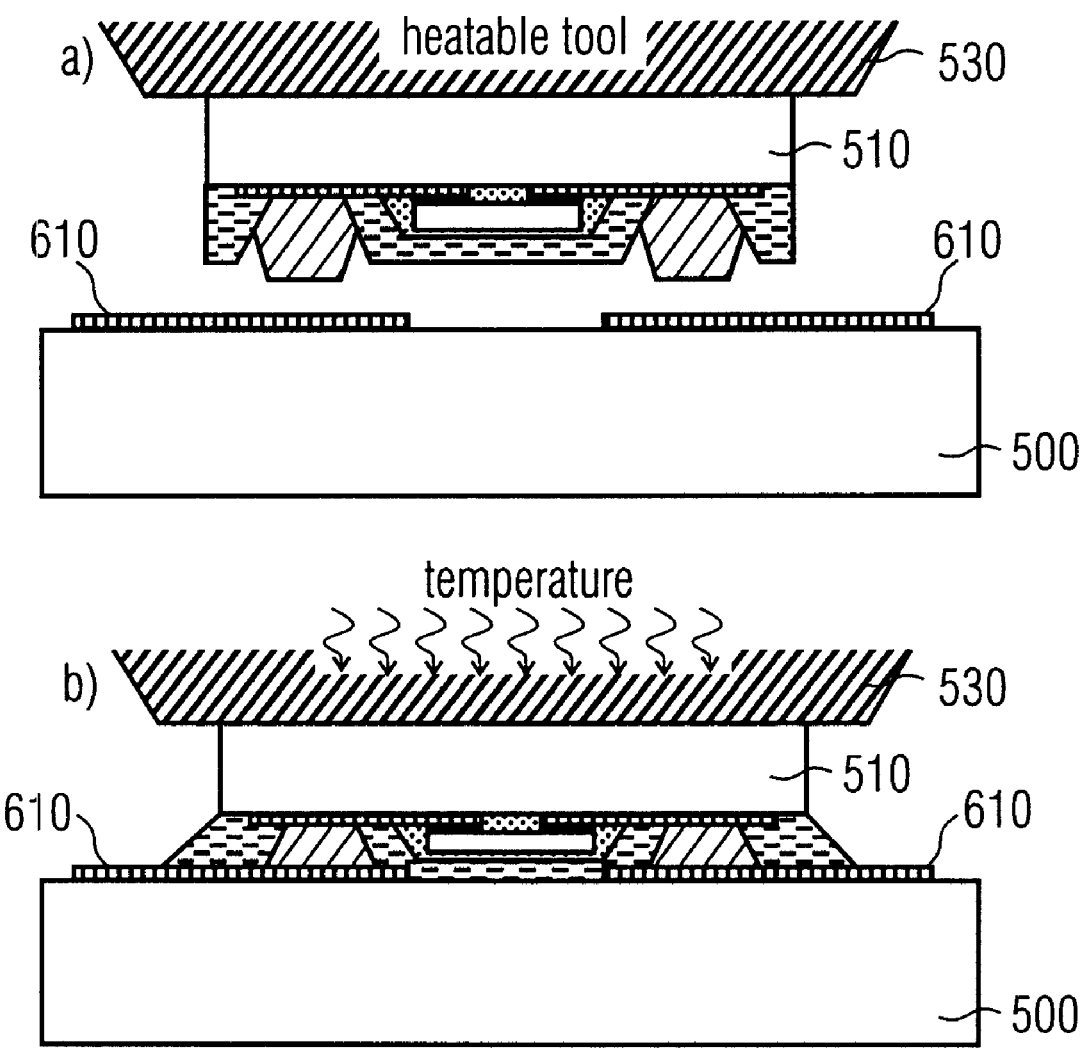
FIGS. 6a and b show an embodiment of a further processing method enabled by the present invention.
Figure 7:
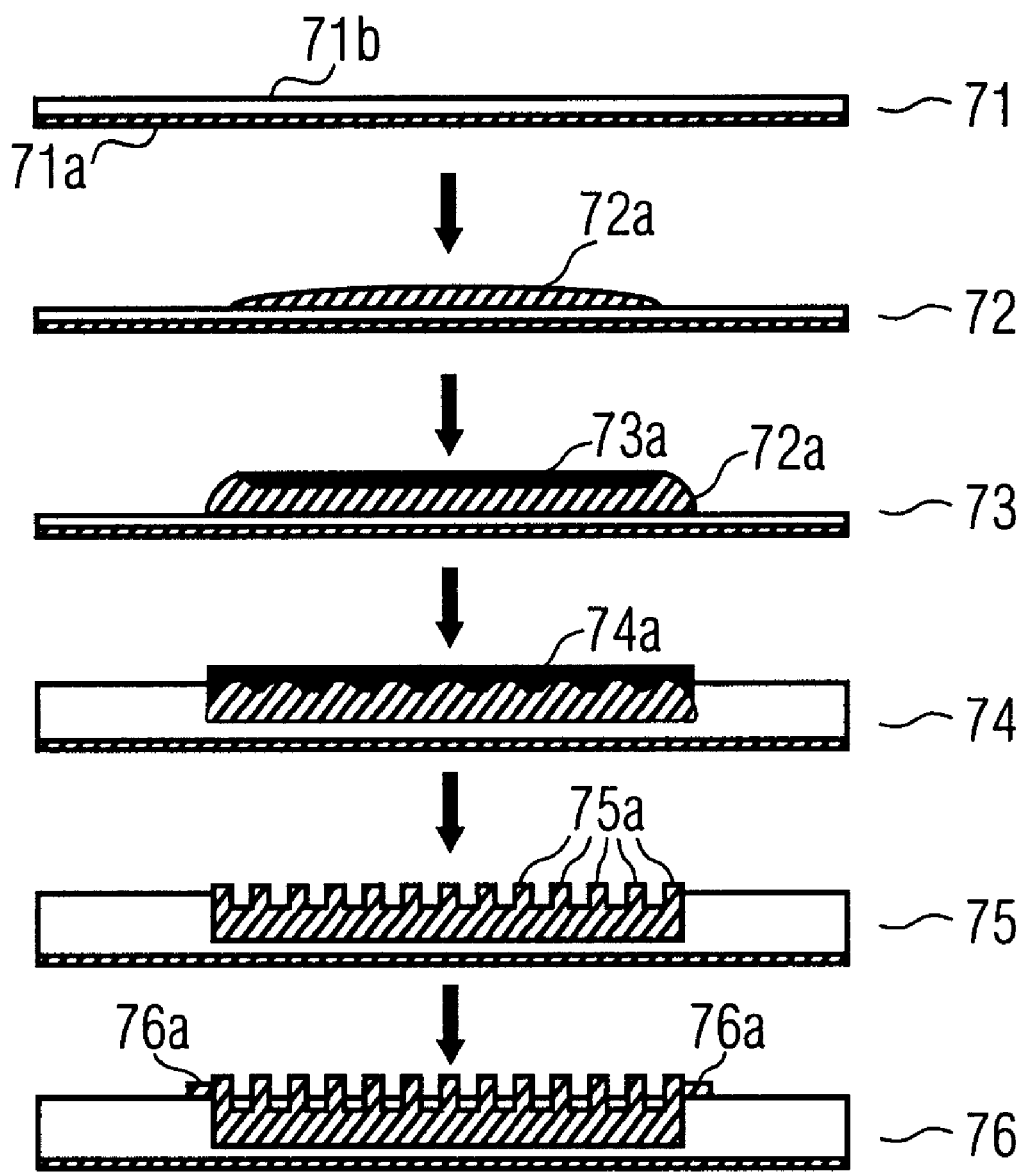
FIG. 7 shows the steps of a known method for producing integrated flexible circuits.

Another embodiment of the production method according to the invention is represented in FIGS. 6a and 6b. Each of FIGS. 6a and 6b represent an assembly 500 onto which the flexible integrated circuit 510 is to be mounted. A heatable tool 530 first of all holds the integrated circuit 510 to be mounted, according to the representation in FIG. 6a. In FIG. 6b, the integrated flexible circuit 510 is pressed to the assembly 500 by the heatable tool 530, and is heated. The heating is represented in FIG. 6b by the zigzag-shaped arrows. By pressing the integrated flexible circuit 510 onto the assembly 500 and simultaneously heating, the contact surfaces 170 of the integrated flexible circuit 510 melt and get bonded with the contact surfaces 610 of the assembly. The flexible integrated circuit 510 is thus, in one process step, both separated and electrically and mechanically coupled to the assembly 500.

Embodiments of the present invention provide the advantage that the IC package has an extremely flat design. According to the embodiments of the present invention, the production is very economical and efficient thanks to the use of continuous processes, i.e. the continuous provision of the packaged flexible integrated circuits. The packages are mechanically flexible, which results in possibilities of using them in flexible electronic systems. Furthermore, it is assumed that a higher level of reliability is achieved as regards thermomechanical stresses.

Another advantage of the present invention is that it allows a production of the IC package directly in a reel-to-reel method or process. Further processing, such as for example component tests, markings and assembly, can furthermore occur in a reel-fed way. Therefore, the sorting into belts for automatic component insertion is omitted.

Furthermore, embodiments of the present invention have the advantage that the assembly of flexible or flat assemblies is simplified for the user. He/She does not need special tools for handling and placing ultra thin ICs. For processing the flexible package, standard methods of SMD assembly can be used. In principle, embodiments of the present invention provide the possibility of a simple assembly of a flexible IC package, according to the embodiments described above, for example by means of hot-lamination onto an assembly.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. A method for producing electronic assemblies with packaged integrated circuits which are mechanically flexible and can be provided contiguously on a common carrier substrate, comprising:
   continuously providing the flexible packaged integrated circuits, the flexible packaged integrated circuits being arranged between first and second flexible substrates and connected to conductor-line patterns of the first flexible substrate, recesses being provided in the first or second flexible substrates in order to make the conductor-line patterns of the first flexible substrate accessible, and
   mounting one of the provided packaged integrated circuits on one of the electronic assemblies, comprising the following sub-steps:
      mechanically and electrically connecting the one packaged integrated circuit to the one electronic assembly; and
      separating the packaged electrical circuit from the packaged integrated circuits supplied contiguously; wherein
   the sub-steps of mechanically and electrically connecting and of separating are performed as a single process.

2. The method according to claim 1, wherein the step of continuously providing is performed by unreeling the packaged integrated circuits from a reel arrangement.

3. The method according to claim 1, wherein the sub-step of separating is performed by die-cutting the packaged integrated circuits.

4. The method according to claim 3, wherein the die-cutting is performed by a heatable punching tool.

5. The method according to claim 1, wherein the sub-step of mechanically and electrically connecting are performed by soldering, gluing, bonding and/or welding.

6. The method according to claim 1, wherein the sub-steps of mechanically and electrically connecting and of separating are performed simultaneously.

7. The method according to claim 1, wherein the sub-step of mechanically and electrically connecting comprises applying a conductive thermoplastic bonding material as the bonding material.

* * * * *